US005288945A

United States Patent [19]

Bruce

[11] Patent Number: 5,288,945

[45] Date of Patent: Feb. 22, 1994

[54] ELECTRIC OUTLET SAFETY PLATE

[76] Inventor: Wayne K. Bruce, P.O. Box 661, Siletz, Oreg. 97380

[21] Appl. No.: 906,415

[22] Filed: Jun. 30, 1992

[51] Int. Cl.5 .......... H05K 5/03

[52] U.S. Cl. .......... 174/67; 439/147

[58] Field of Search .......... 174/67; 220/242; 439/135, 136, 147

[56] References Cited

U.S. PATENT DOCUMENTS 2,000,318 5/1935 Cannon .
2,516,464 7/1950 Hooser .......... 174/67
2,744,243 5/1956 Menendez .......... 174/67 X
4,453,793 6/1984 Panek et al. .
4,607,136 8/1986 Thomas .......... 174/67
4,810,833 3/1989 Meyers .......... 174/67
4,914,265 4/1990 Mongeau .......... 174/67 X
4,922,056 5/1990 Larsson .......... 174/65 R
4,952,756 8/1990 Meyers .......... 174/67

FOREIGN PATENT DOCUMENTS 187959 12/1956 Austria .
3440043 5/1986 Fed. Rep. of Germany .

*Primary Examiner*—Gerald P. Tolin
*Assistant Examiner*—David Tone
*Attorney, Agent, or Firm*—John F. Ingman

[57] ABSTRACT

An electric outlet safety plate incorporates sliding cover elements which, in various positions, cover the electric outlet when not in use, open for insertion of an electric plug, and grasp the plug to prevent removal. A plate member includes a groove extending outwardly to the side from each of the electric outlet openings. A pair of substantially identical sliding members engage the groove from opposing sides of the plate member. The sliding members include an outlet covering portion which is spaced from the outer surface of the electric outlet and has its inner edges toothed to enhance their grasp upon the electric plug. The sliding members are lockable against outward movement on the plate member. Teeth are formed upon the plate member so as to extend within the groove, and a second set of teeth are formed upon the sliding member so as to releasably engage the teeth of the plate member. The sliding member teeth are formed upon a resilient arm which is biased to engagement, but may be disengaged by finger pressure. Where the plate member teeth are formed on both sides of the groove and the sliding member teeth are formed on each of a pair of resilient arms thereon, release occurs by pressing the two arms towards each other. A ratchet tooth structure may be used to allow direct inward movement of the sliding members, but which requires disengagement to move the sliding members outwards toward the uncovered position.

12 Claims, 2 Drawing Sheets

ELECTRIC OUTLET SAFETY PLATE

BACKGROUND OF THE INVENTION

1. Field of the Invention

This invention involves an electric outlet safety plate and, more particularly, an electric outlet safety plate having a bifurcated outlet covering which locks at various positions of closure.

2. Description of the Prior Art

A need exists to provide an electrical connection to an electric outlet which is not readily disconnectable by accident or by small children. This need is particularly applicable to the electric connection for computers, wherein disconnection may mean loss of data, as well as to the connection of other memory devices such as video cassette recorders, alarm clocks, and the like.

A need also exists to provide a safety cover for electric outlets which may be secured in such a manner so as not to be readily opened by curious children having a hairpin or similar short-circuiting item available.

Previous designs have provided for connecting means between an electric plug and a receptacle which provide for a locking interaction designed to the plug-receptacle combination. Similarly, hinged or threaded coverings which particularly protect outlet openings against the environment are available. However such designs are not suitably protective against access by children, nor particularly convenient for subsequent use.

What is needed is an electric outlet safety plate having an outlet covering which may be closed to prevent exploration by children and which, additionally, may be adjusted to secure a conventional electric plug into the electric outlet so that it may not readily be removed therefrom by accident or by children.

SUMMARY OF THE INVENTION

The present invention involves an electric outlet safety plate which has been designed to meet the aforementioned needs. An outlet safety plate incorporates locking, sliding cover elements which cover the electric outlet when not in use and which grasp an electric plug to prevent removal when in use.

Accordingly, in the preferred embodiment, the electric outlet safety plate includes a plate member for duplex outlets having a groove extending outwardly to the side from each of the electric outlet openings, wherein a pair of substantially identical sliding members engage the groove from opposing sides of the plate member. The sliding members are formed to include, at their inner ends, an outlet covering portion which is spaced from the outer surface of the electric outlet. When the sliding members are moved fully inwards toward the outlet, the two outlet covering portions abuttingly engage to completely cover the electric outlet. When the sliding members are moved outwards, they separate so as to expose the face of the electric outlet for the conventional insertion of an electric plug. When it is desired to secure the plug in the outlet, the sliding members are moved inwards so that the covering portions of the sliding members press against the plug, with the perimeter lip of the electric plug being located within the space between the covering portions of the sliding members and the outer surface of the electric outlet, so as to prevent withdrawal of the electric plug. The inner edges of the covering portions may be toothed in form to enhance their grasp upon the electric plug, however such toothing should be aligned to mesh without any significant gap when the sliding members are at their inward or closed position.

The sliding members are capable of being locked against outward movement on the plate member. A preferred means of locking the sliding members at various positions within the groove includes a series of teeth formed upon the plate member so as to extend within the groove, and a second series of teeth formed upon the sliding member so as to releasably engage the first series of teeth. Release of the engaged teeth may be accomplished by forming the second series of teeth upon a resilient arm which is biased to engagement, but may be disengaged by finger pressure upon an extension from the arm in a direction away from the teeth engagement. Where the first series of teeth are formed on both sides of the groove and the second series of teeth are formed on a pair of resilient arms on the sliding member, release occurs by pressing the two arms towards each other. After tooth disengagement, continued pressure combined with sideways movement will move the sliding member to the desired position within the groove. In the preferred embodiment, a ratchet tooth structure is preferred which will allow the sliding members to be moved inwards toward the covering position without teeth disengagement, but which requires disengagement to move the sliding members outwards toward the uncovered position.

DESCRIPTION OF THE PREFERRED EMBODIMENT

Figure 1:
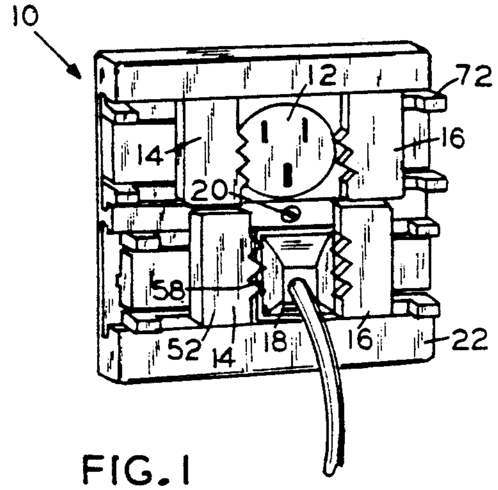
FIG. 1 illustrates a perspective view of the electric outlet safety plate in use where the upper outlet is closed and an electric plug is grasped in the lower outlet.

Turning now to the drawings, there is shown in FIG. 1 a perspective view of an installed electric outlet safety plate 10 of the present invention, wherein one electric outlet 12 is exposed with the sliding members 14 and 16 in a separated position, and the other electric outlet has an electric plug 18 inserted therein with sliding members 14 and 16 having been moved inwardly to grasp the electric plug 18 so as to retain it in its inserted position. The outlet plate 10 is conventionally attached by a single, centrally located screw 20 through the plate member 22 to a common duplex outlet having two vertically aligned electric outlets 12.

Figure 2:
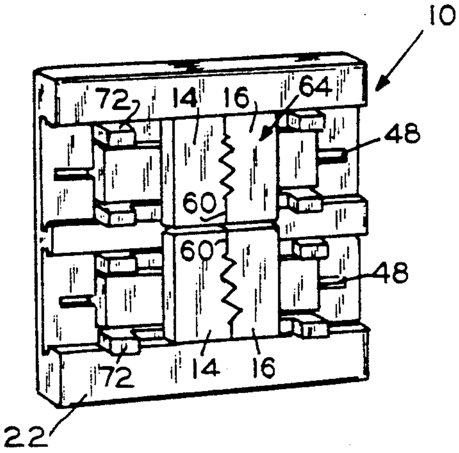
FIG. 2 illustrates a perspective view of the electric outlet safety plate where the electric outlets are covered.

FIG. 2 illustrates the outlet plate 10 where the location of the two electric outlets 12 are covered by mutually abutting sliding members 14 and 16.

Figure 3:
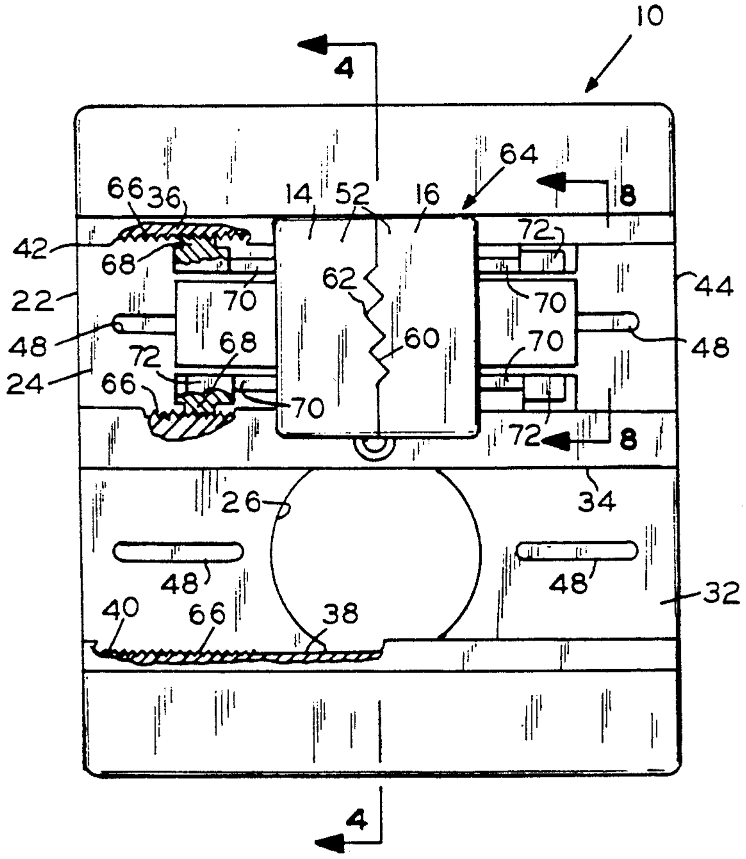
FIG. 3 illustrates a plan view of the electric outlet safety plate with the sliding members for a lower outlet removed for clarity.
Figure 4:
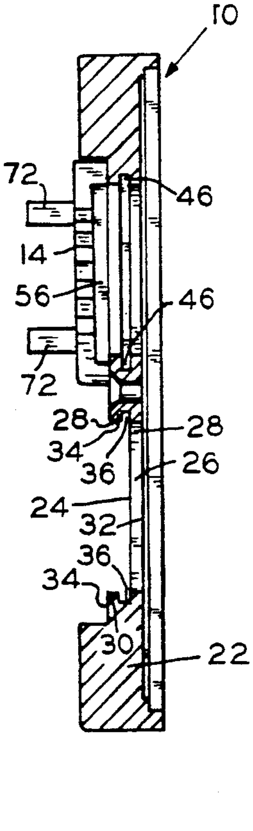
FIG. 4 illustrates a cross sectional view of the electric outlet safety plate as seen at line 4—4 of FIG. 3.
Figure 5:
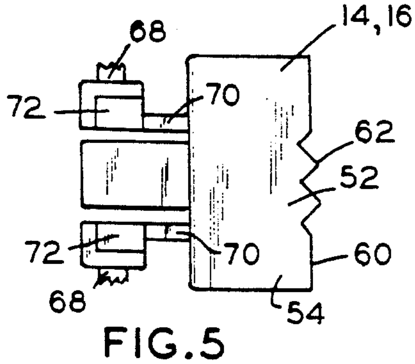
FIG. 5 illustrates a top view of the sliding member of the electric outlet safety plate.
Figure 6:
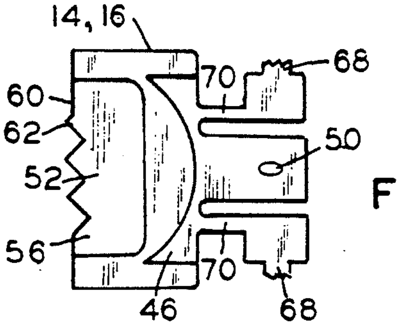
FIG. 6 illustrates a bottom view of the sliding member of FIG. 5.
Figure 7:
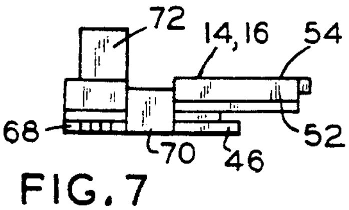
FIG. 7 illustrates a side view of the sliding member of FIG. 5.
Figure 8:
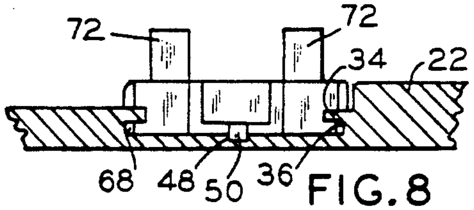
FIG. 8 illustrates a side view of the sliding member of the electric outlet safety plate as seen at line 8—8 of FIG. 3.

FIGS. 3 and 4 show views of the electric outlet safety plate 10 with sliding members 14 and 16 for the lower electric outlet having been removed for clarity in description of the invention.

The plate member 22 has a broad horizontal groove 24 extending across and outwardly from each of the electric outlet openings 26. Along each side 28 and 30 of the groove 24, parallel to the bottom surface 32 of the groove 24, a projecting rim 34 extends so as to form a track 36 on each side 28 and 30 proximate the bottom surface 32 of the groove 24. The track 36 is smooth at the center portion 38 of the groove 24 proximate the outlet opening 26, and is toothed, as described subsequently, at the outer ends 40 of the groove 24.

Sliding members 14 and 16, which may be substantially identical, engage the groove 24 from opposing sides 42 and 44 of the plate member 22 and are formed with opposing flanges 46 which engage the tracks 36 within the groove 24. Centered and running longitudinally along the bottom surface 32 of the groove 24 is a channel 48 of limited length, which, when engaged by a projection 50 extending from the sliding member 14, 16 limits the outward, and inward, movement of the sliding member 14, 16.

Each sliding member 14, 16 is formed to include an outlet covering portion 52 at an inner end 54. When the two sliding members 14 and 16 engaging a groove 24 are fully moved inwards toward the outlet opening 26, the two outlet covering portions 52 meet and abuttingly engage each other to completely cover an electric outlet 12. When the two sliding members 14 and 16 are moved fully outwards, they separate so as to expose the electric outlet 12 to permit the conventional insertion of an electric plug 18.

Subsequent to insertion of the electric plug 18, if it is desired to secure the plug 18 in the outlet 12, the sliding members 14 and 16 are moved inwards so that the covering portions 52 of the sliding members 14 and 16 engage against the plug 18. The outlet covering portions 52 are formed with a space 56 therein so that a perimeter lip 58 of the electric plug 18 is trapped within that space 56 between the covering portion 52 of the sliding member 14, 16 and the electric outlet 12, preventing withdrawal of the electric plug 18. The abutting edges 60 of the covering portions 52 may have teeth 62 to enhance their grasp upon the electric plug 18, however such teeth 62 should mesh without any significant gap when the sliding members 14 and 16 are at their inward or closed position 64.

The sliding members 14 and 16 are locked against outward movement at the closed position 64, and at various interim positions where an electric plug 18 may be grasped, by the mutual engagement of a series of teeth 66 formed within the tracks 36 located in the groove 24 of the plate member 22, and a second series of teeth 68 formed upon the sliding member 14, 16. The second series of teeth 68 are formed, in the preferred embodiment, upon a resilient arm 70 which is biased to engagement, but which may be disengaged by finger pressure upon an extension 72 from the resilient arm 70 in a direction 71 away from the teeth engagement. Where the first series of teeth 66 are formed in the tracks 36 on both sides 28, 30 of the groove 24 and the second series of teeth 68 are formed on a pair of resilient arms 70, each engaging a toothed track 36, release occurs by pressure on the two outwardly projecting extensions 72 towards each other. After tooth disengagement, continued pressure on the extensions 72 combined with outward sideways movement, will move the sliding member 14, 16 to the desired location in the groove 24. Performing this operation on both sliding members 14 and 16 will expose the electric outlet 12 to permit insertion or removal of the electric plug 18.

Figure 9:
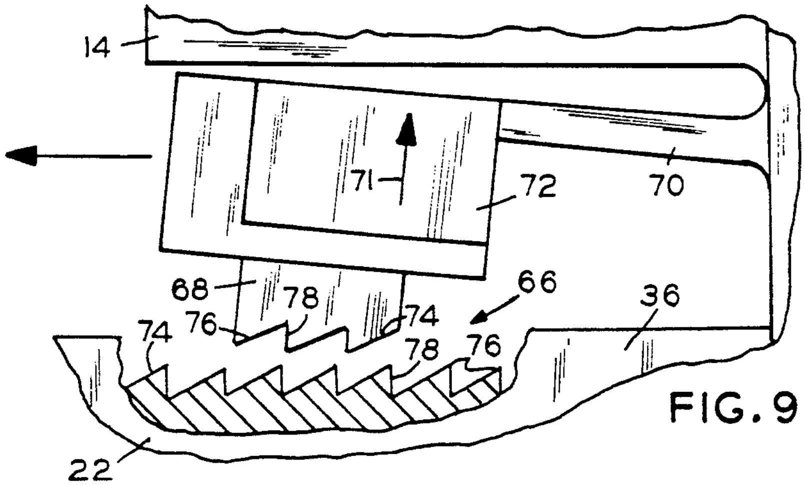
FIG. 9 illustrates an enlarged view of the ratchet tooth structure while disengaged.
Figure 10:
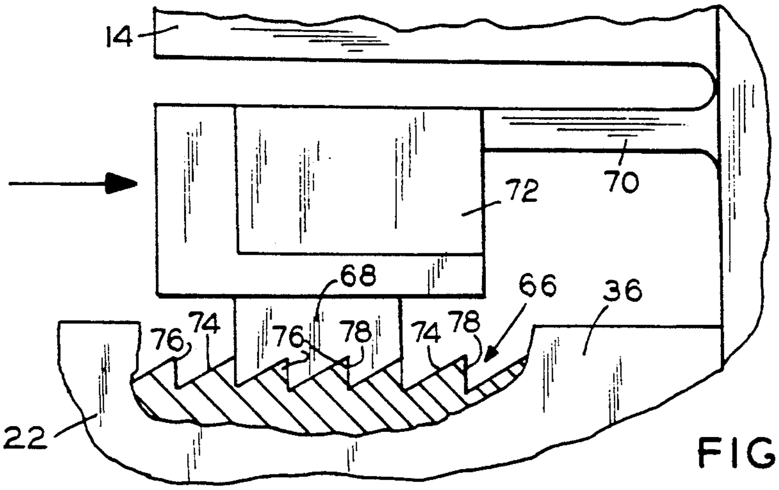
FIG. 10 illustrates an enlarged view of the ratchet tooth structure while engaged.

Preferably, the tooth structure is, as best seen in FIGS. 9 and 10, of a ratchet-tooth type where an inclined section 74 of each tooth 76 terminates with an abrupt or transverse tooth edge 78 as illustrated. In order to move the sliding member 14, 16 towards the center or closed position 64, as seen in FIG. 10, the user merely presses the outwardly projecting extensions 72 of the sliding member 14, 16 towards the outlet opening 26 without tooth disengagement, the teeth 68 of the sliding member 14, 16 sliding along and across the teeth 66 of the plate member 22. However, when separating or moving the sliding members 14 and 16 away from the outlet opening 26, as seen in FIG. 9, disengagement of the teeth 66, 68 is required. This requirement for disengagement of the teeth 66, 68 prevents children from accidentally exposing the electric outlet 12 or the accidental unplugging of an electrical plug 18 therefrom.

It is thought that the electric outlet safety plate 10 of the present invention and its many attendant advantages will be understood from the foregoing description and that it will be apparent that various changes may be made in form, construction and arrangement of the parts thereof without departing from the spirit and scope of the invention or sacrificing all of its material advantages, the forms hereinbefore stated being merely exemplary embodiments thereof.

I claim:

1. An electric outlet safety plate, comprising:

a. a plate member including at least one electric outlet opening;

b. a first sliding member;

c. a second sliding member;

d. means for slidingly engaging said first and second sliding members upon said plate member; and e. means for locking said first and second sliding members in a plurality of positions relative to said plate member which includes a position where said first and second sliding members abut so as to substantially cover the electric outlet opening.

2. An electric outlet safety plate, as recited in claim 1, wherein said means for locking said first and second sliding members in a plurality of positions include means for tooth engagement.

3. An electric outlet safety plate, as recited in claim 2, wherein said means for tooth engagement include:

a. at least one tooth formed upon the plate member;

b. at least one tooth formed upon the sliding member so as to releasably engage said tooth formed upon the plate member.

4. An electric outlet safety plate, as recited in claim 2, wherein said means for tooth engagement include:

a. a first series of teeth formed upon the plate member;

b. a second series of teeth formed upon the sliding member so as to releasably engage said first series of teeth.

5. An electric outlet safety plate, as recited in claim 2, wherein said means for tooth engagement include:

a. a series of teeth formed upon the plate member;
b. at least one tooth formed upon the sliding member so as to releasably engage said series of teeth on the plate member.

6. An electric outlet safety plate, as recited in claim 2, wherein said means for tooth engagement include:

a. at least one tooth formed upon the plate member;
b. a series of teeth formed upon the sliding member so as to releasably engage said tooth formed upon the plate member.

7. An electric outlet safety plate, comprising:

a. a plate member including at least one electric outlet opening;
b. a first sliding member;
c. a second sliding member;
d. means for slidingly engaging said first and second sliding members upon said plate member; and
e. means for locking said first and second sliding members in a plurality of positions relative to said plate member which includes a position where, an electric plug having been inserted into said electric outlet opening, said first and second sliding members engage said electric plug so as to resist withdrawal of said electric plug.

8. An electric outlet safety plate, comprising:

a. a plate member including at least one electric outlet opening;
b. a first sliding member;
c. a second sliding member;
d. means for slidingly engaging said first and second sliding members upon said plate member which include:
   (1) a horizontal groove formed in said plate member extending outwardly from the electric outlet opening and having opposing parallel sides wherein along each side of the groove a projecting rim forms a track;
   (2) said first and second sliding members having opposing flanges formed thereon which slidingly engage said tracks formed along the sides of the groove; and
e. means for locking said first and second sliding members in a plurality of positions relative to said plate member.

9. An electric outlet safety plate, as recited in claim 8, wherein said means for locking said first and second sliding members in a plurality of positions includes:

a. said tracks of said plate member having extending therein at least one tooth;
b. said sliding members each having formed, upon a resilient arm thereof, at least one tooth, said resilient arm being biased to toothed engagement with said tooth of said plate member but releasable therefrom by finger pressure thereupon.

10. An electric outlet safety plate, comprising:

a. a plate member including at least one electric outlet opening;
b. a first sliding member;
c. a second sliding member;
d. means for slidingly engaging said first and second sliding members upon said plate member;
e. means for locking said first and second sliding members in a plurality of positions relative to said plate member; and
f. a channel formed upon the plate member and a projection formed upon each sliding member which engages said channel, said channel being formed in conjunction with said projection to limit the extent of sliding movement of the sliding member upon the plate member.

11. An electric outlet safety plate, comprising:

a. a plate member including at least one electric outlet opening;
b. a first sliding member;
c. a second sliding member;
d. means for slidingly engaging said first and second sliding members upon said plate member; and
e. means for locking said first and second sliding members in a plurality of positions relative to said plate member which include means for tooth engagement using ratchet-type teeth, each having an inclined edge followed by a transverse tooth edge, so as to permit a sliding member to be moved toward the electric outlet opening without disengagement of teeth but requires disengagement for movement away from said electric outlet opening.

12. An electric outlet safety plate, comprising:

a. a plate member including at least one electric outlet opening;
b. a first sliding member;
c. a second sliding member;
d. means for slidingly engaging said first and second sliding members upon said plate member; and
e. means for locking said first and second sliding members in a plurality of positions relative to said plate member;
f. said first sliding member and said second sliding member each being formed with an electric outlet covering portion which is spaced parallel from the electric outlet opening; and
g. said electric outlet covering portions having mutually abutting inner edges which are toothed in form to enhance their grasp upon an electric plug.

* * * * *